United States Patent [19]

Cobaugh et al.

[11] 4,164,362

[45] Aug. 14, 1979

[54] MODULAR CARD CAGE WITH MULTIPLE POWER BUS BAR MEANS

[75] Inventors: Robert F. Cobaugh, Elizabethtown; Donald J. Doty, Hershey, both of Pa.

[73] Assignee: AMP Incorporated, Harrisburg, Pa.

[21] Appl. No.: 777,279

[22] Filed: Mar. 11, 1977

[51] Int. Cl.² .......................... H05K 1/12; H05K 1/14
[52] U.S. Cl. ......................... 339/17 M; 339/176 MP; 361/415
[58] Field of Search ............. 339/17 L, 17 M, 75 M, 339/176 MP, 17 LC; 361/399, 413, 415

[56] References Cited

U.S. PATENT DOCUMENTS

| | | | |
|---|---|---|---|
| 3,205,298 | 9/1965 | Kalt | 339/17 M X |
| 3,704,394 | 11/1972 | Johnson | 339/17 M X |

FOREIGN PATENT DOCUMENTS 1197139 7/1965 Fed. Rep. of Germany ........... 361/415

Primary Examiner—E. F. Desmond

Attorney, Agent, or Firm—AMP Incorporated

[57] ABSTRACT

A card cage for holding printed circuit cards comprising modular cage elements each having a pair of parallel slots formed therein and spaced apart a distance to slidably receive the edges of a printed circuit card and to retain said card therein. The said modular elements are stacked together, one upon the other, to form the card cage with each module having contact retaining cavities formed in the corners thereof. Securing means in the form of conductive rods or bolts extend through the corner edges of the stack of card holding modules to supply the required power supply voltages into the card cage system and also to secure together the stack of modules. Such conductive rods are exposed to the cavities in the ends of the modules. Individual contact means retained in the cavities connect the rods or bolts to conductive areas on the corners of the individual printed circuit cards and thereby supply the power voltages to said cards.

5 Claims, 5 Drawing Figures

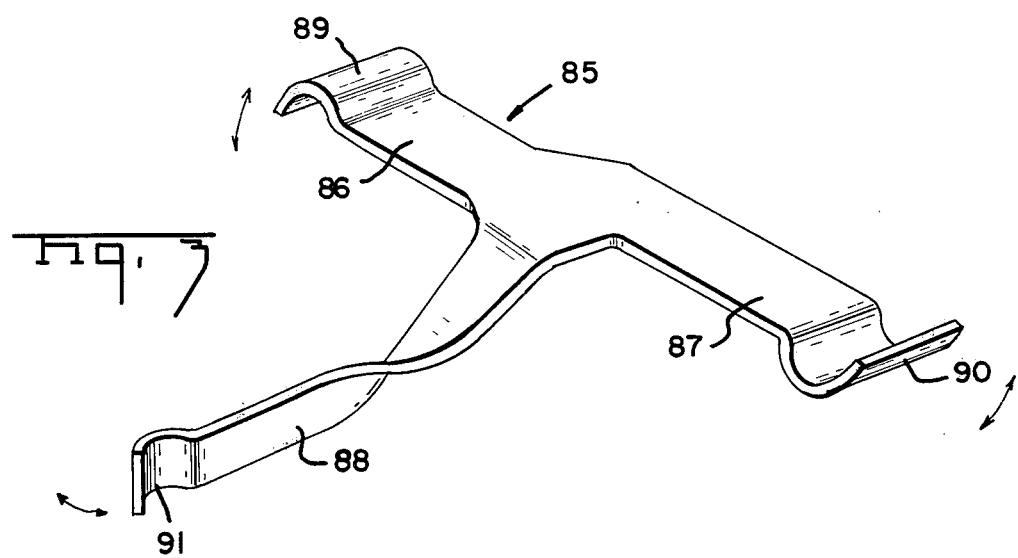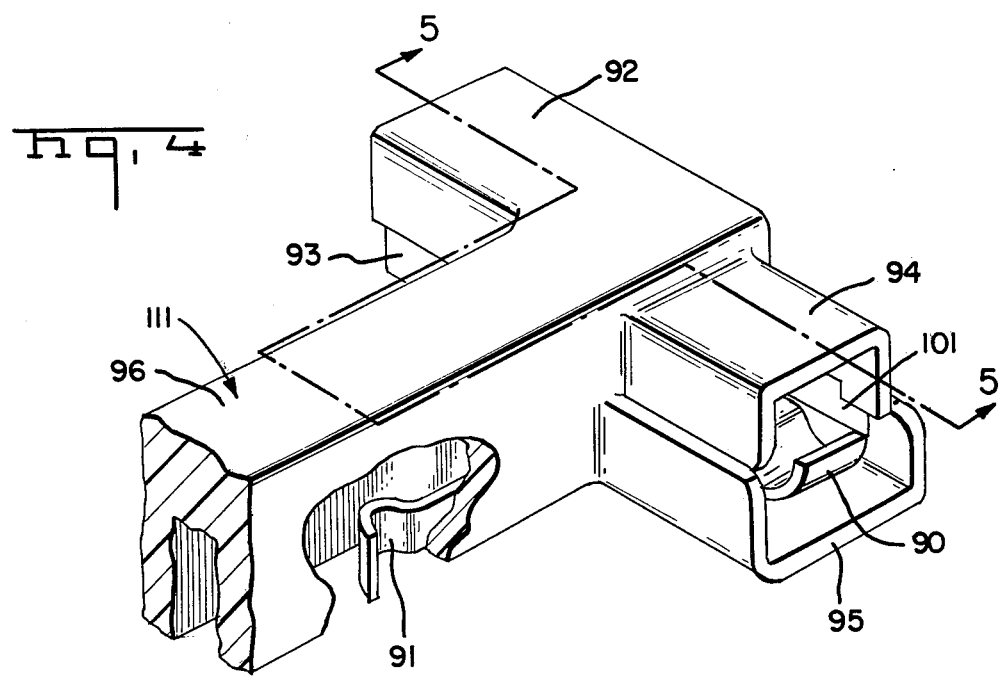

MODULAR CARD CAGE WITH MULTIPLE POWER BUS BAR MEANS

BACKGROUND OF THE INVENTION

This invention relates generally to means for packaging printed circuit boards into a functional piece of electronic equipment and more particularly the invention relates to an arrangement of printed circuit board retaining modules which are stackable, one upon the other, with two or more power bus bars extending through the stack of modular card retaining modules to secure said modules together and also to supply two or more power supplies to the printed circuit cards inserted in the individual retaining modules.

In the present state of the art printed circuit boards are commonly retained in card cages. Such card cages function generally to receive printed circuit cards in slots formed in the card cage in such a manner that the cards are stacked one upon the other and spaced apart predetermined distances. Interconnections between the cards are commonly made by a back panel which can have a plurality of card edge connectors secured thereon, each of which receives one of the printed circuit boards. The interconnections between the printed circuit boards are commonly made by point-to-point wiring between terminal posts which extend through the back panel and into the card edge connectors where they make contact with circuit pads on the edge of the printed circuit boards.

Various power supplies are required for most systems and can consist of two or more different DC voltages which are supplied to the printed circuit boards by separate power supply voltage carrying conductors which are connected to appropriate terminals on the back panel.

Other known means of supplying power to the printed circuit boards include multi-layer back panels in which one of the conductive levels has sufficient current carrying capacity to feed the various circuit boards. Such electric current, however, can amount to several hundred amperes in the case of fairly complex electronic systems which might utilize several tens of printed circuit boards, with a large number of integrated circuit chips mounted on each circuit board. Each printed circuit board could, for example, easily require twenty-five to thirty amperes.

The problems of supplying power to the circuit boards by means of separate conductors lie largely in the relatively large number of conductors required. The problems of supplying power to the various circuit boards by means of conductive levels in the back panel lie primarily in the heat dissipation problems involved in conducting such a large number of amperes in the relatively constrained conductive levels on the back panel.

A further problem in the use of multi-level printed circuit boards for the purpose of supplying power to the printed circuit boards lies in the difficulty of connecting both the power supplying leads and the signal supplying leads to the edge of the printed circuit board from the common back panel system.

BRIEF STATEMENT OF THE INVENTION

It is a primary object of the invention to supply two or more DC voltage power supplies to the circuit boards contained in a modular type card cage by bus bar means which also function to secure said card cage modules together in a completed card cage assembly.

It is a second purpose of the invention to provide a card cage comprised of individual modules which are held together in a stacked arrangement by conductive rods which extend through the corners thereof and which also function to provide the various power supplies voltages required by the printed circuit cards retained within the card cage.

It is a third aim of the invention to provide a card cage made up of individual modules each of which can retain a printed circuit card and which can be stacked together to form an assembled card cage secured together by either conductive rod-like means extending through the corners thereof or heavy interlocking connector means positioned at the corners of said modules, and in which both said rod-like means and said interlocking connector means have sufficient current carrying capability to supply power to the printed circuit cards retained within said card cage.

It is a further purpose of the invention to improve modular type card cages and the means for supplying power thereto, generally.

In accordance with one form of the invention the assembled card cage is formed of individual card retaining modules which modules are stackable one upon the other to form the card cage capable of receiving and retaining a plurality of printed circuit cards stacked one upon the other and spaced apart a distance determined by the width of the card retaining modules.

The modules of the card cage are held together either by means such as long rods or bolts extending through the corners of the modules, or a series of heavy duty connectors which mechanically engage each other and preferably are positioned near the corners of the modules. Both the rods and the connectors are also employed to bring in power to the circuit cards. When conductive rods are employed contact means are supplied at the corner of each module which connect the rods to a conductive pad near the corner of the circuit card which slides into the module and supplies power to said conductive pad. In those instances where the modules are secured together by heavy duty connector means such connector means are constructed to mechanically connect to each other to form a continuous connection through the corner edges of the card cage but also connect to conductive pads on the corners of each of the circuit cards. Both the rods or bolts and the heavy duty connector means are of sufficient current carrying capabilities to carry the necessary current for all of the circuit cards therein and to distribute such power to the circuit cards as discussed above, and in parallel, through contacts extending from said rod or heavy duty connectors as discussed above.

In accordance with a feature of the invention there can be four or more power supply rods or heavy duty contact arrangements located at the four corner edges of the card cage. A conductive pad can also be positioned at each of the four corners of each of the circuit cards to engage the power supply bus bars in the manner described above. The four power supply receiving conductive pads can be of different lengths so that they contact the power supply bus bars in a predetermined time sequence as they are inserted into the card cage, and they disengage the four bus bars in the reverse predetermined time sequence as they are removed from the card cage. Such time sequential engagement of the conductive pads with the power supplies permits ground to be connected first and thereafter permits the various values of the power supplies to be connected in a predetermined order, thereby ensuring against damage to the components to which the power supplies are connected.

BRIEF DESCRIPTION OF THE DRAWINGS

The above objects and other objects and features of the invention will be more fully understood from the following detailed description thereof when read in conjunction with the drawings in which:

FIG. 3 is a perspective view of a three legged contact which is retained within the housing of the portion of the card cage module shown in FIG. 2; and FIG. 4 shows a perspective view of a portion of a card cage module with heavy duty current carrying contacts therein which connect adjacent modules together to perform the function of securing the card cage as well as conduct the power supply current;

FIG. 5 is a sectional view of the broken away portion of the card cage module shown in FIG. 3 taken along the plane 5-5 thereof and showing the opening by which the three legged contacts can be inserted into the card cage module.

DETAILED DESCRIPTION OF THE INVENTION

Figure 1:
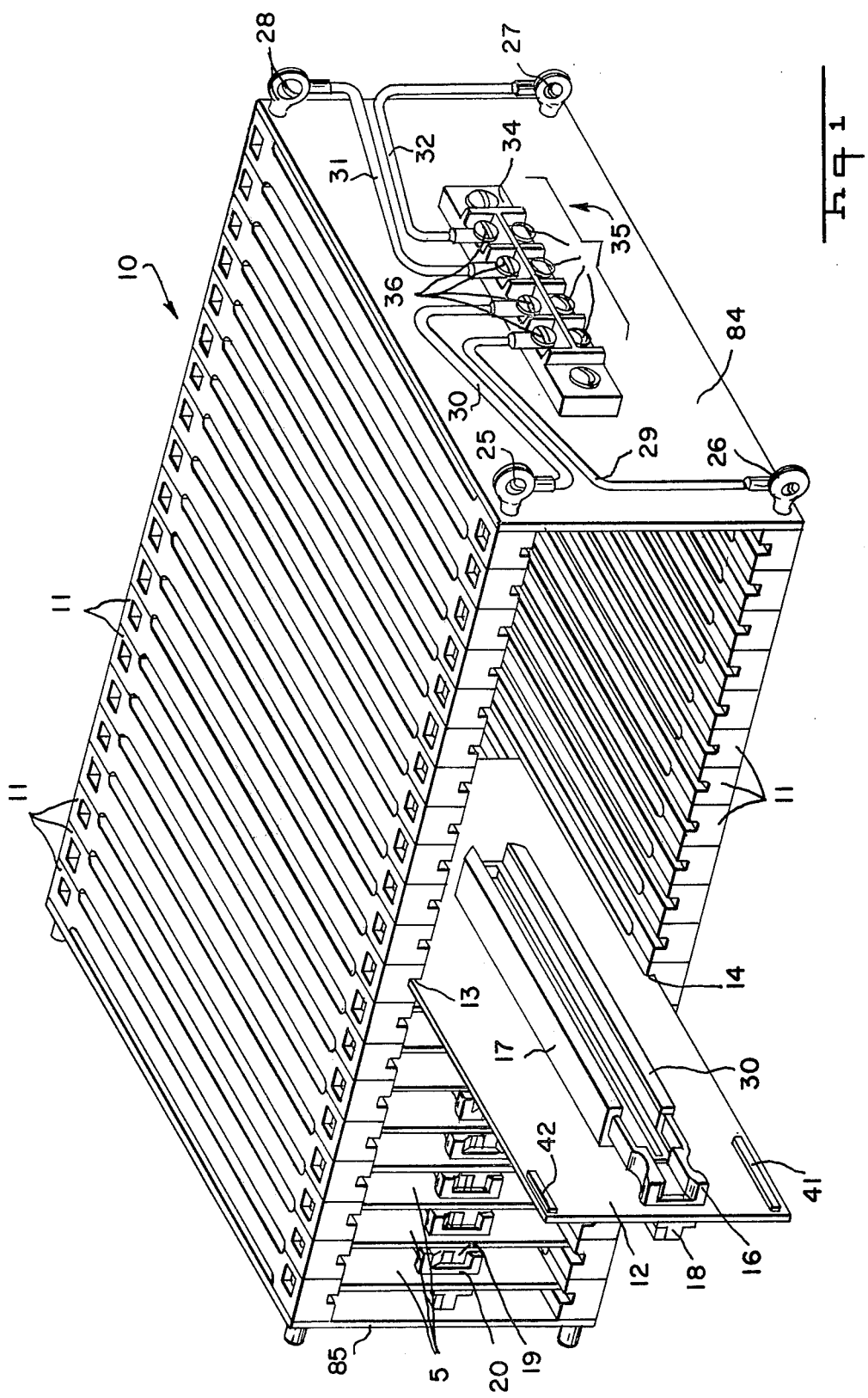
FIG. 1 is a perspective view of an assembled modular card cage with one printed circuit card being shown partially inserted in the cage and with the modules being secured together at the four corners thereof by rod-like bus bars.
Figure 2:
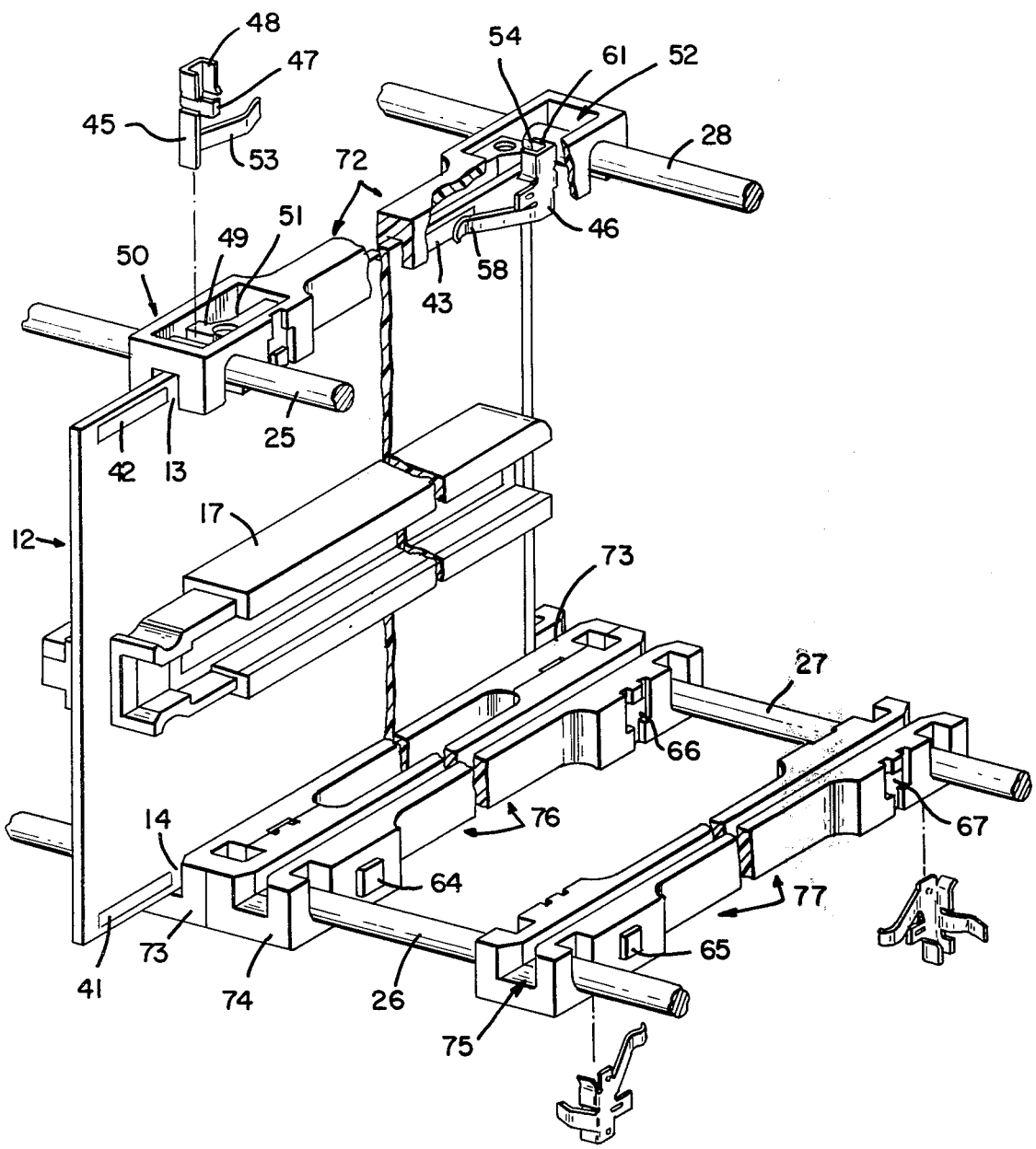
FIG. 2 is a perspective view of a portion of the structure of FIG. 1 with much of it broken away to show the details of the individual card cage modules and the manner in which they are secured together by a rod-like bus bar extending through the corners thereof and further the means by which electrical contact is made between the bus bar and conductive pads located on the corners of the printed circuit cards inserted in the card cage.
Figure 7:
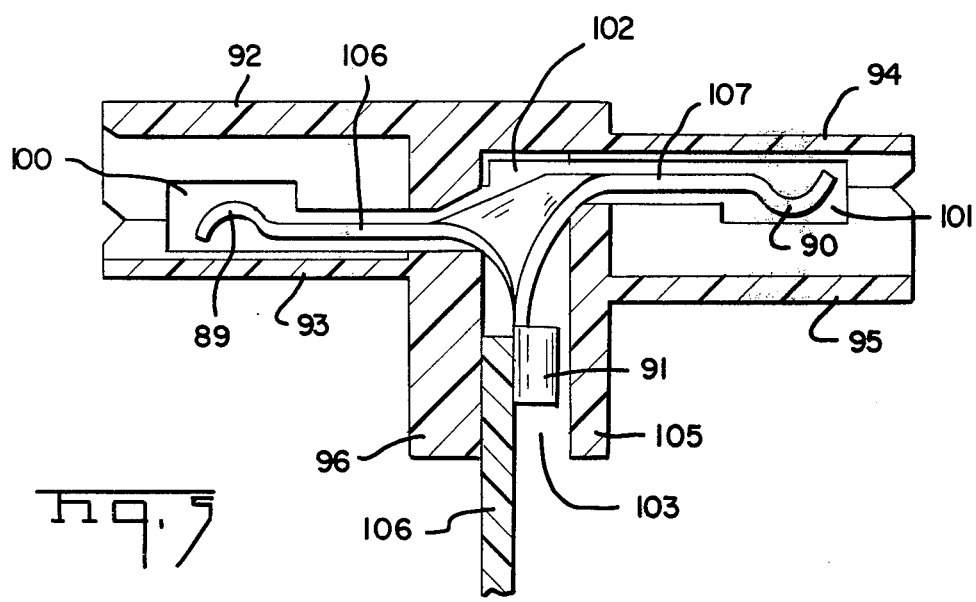

Referring now to FIGS. 1 and 2 there is shown a perspective view of one embodiment of the card cage and a broken-away perspective view in FIG. 2 showing in more detail the relationship of the printed circuit board, the card guide of the card cage and the bolts which extend longitudinally through the corner edges thereof to provide for the supplying of various supply voltages to the printed circuit board retained in the card. More specifically, card cage 10 of FIG. 1 is comprised of a number of modular card guides 11 which contain slots, such as slots 13 and 14 on both the top and the bottom of the individual modular card guides 11 and which function to guide a printed circuit card, such as card 12, into said slots 13 and 14 in the upper and lower sections of card guide 11. One of the circuit boards 12 is shown in FIG. 1 as being inserted part way into the card guide slots 13 and 14. Other cards 5 are shown as being fully inserted into the modular card cage 10.

Each printed circuit card, such as card 12, is shown as having a male 18 and a female connector half 17 secured to opposite sides of such card. For example, the card 12 has a female connector half 17 connected to one side thereof and the male half of the connector 18 connected to the other side thereof. Such female and male connector halves 17 and 18 mate respectively with male and female connector halves mounted on the facing surfaces of adjacent circuit boards. As a specific example, a male connector half 19 can be seen to be mounted on one of the circuit boards 5 and can be seen to be mated with a female connector half 20 mounted on the facing surface of an adjacent circuit board, also identified by reference character 5.

The particular type of male and female connector halves 17 and 18 preferably are of a zero insertion type as discussed in copending application Ser. No. 741,433 filed Nov. 12, 1976, now abandoned, by Robert Franklin Cobaugh et al and entitled "Stacked Printed Circuit Boards And Circuit Board System".

Four conductive rods or bolts 25, 26, 27 and 28 extend longitudinally through the four corner edges of the card cage formed by the individual card guide modules 11. Each of these four bolts 25 through 28 can be employed to supply system voltages of various magnitudes to the circuits in the various circuit boards, such as the typical circuit board 12, and the remaining circuit boards designated generally by reference character 5. The various supply voltages are supplied by input leads, not shown, which are attached to the lugs or screws 35 in the strip terminal 34 and can then be tapped from lugs connected thereto, such as lug 36, and subsequently supplied to the four bolts 25 through 28 by means of leads 29, 30, 31 and 32. Such voltages typically can be, for example, plus five volts, plus twelve volts, minus twelve volts and ground potential.

A more detailed showing of a card guide module element 11 and the means by which the bolts 25 through 28 are connected thereto and subsequently electrically connected to the contact areas, such as conductive areas 41 and 42, on the printed circuit board 12, is shown in FIG. 2.

A pair of contacts 45 and 46, respectively, are employed to connect the bolts 25 and 28 to contact pads 42 and 43 on the circuit board 12 of FIG. 2. The contact 45 has a first leaf spring 53 formed thereon which mates with the contact pad corresponding to contact pad 42 on the side of the circuit board 12, which cannot be seen in FIG. 2.

A second spring leaf contact 47 makes contact with rod 25 when said rod 25 is inserted through the end portion 50 of card guide module 11. The contact 45 is retained within cavity 51 in card guide module 11 by means of a vertical channel 48 formed in contact 45 which fits around shoulder means 49 formed in aperture 51 of card guide module 50.

Similarly, the contact 46 has a spring means 58 which is inserted into an aperture 52 in the other end of the card guide element module 11 with the channel 61 formed in the contact 46 fitting around the shoulder means 54 in card guide module 11. The contact leaf spring 58 mates with the contact area 43 on printed circuit board 12. A contact leaf makes contact with the bolt 28 when said contact 46 is inserted into aperture 52, thereby creating an electrical circuit from the bolt 28 to contact pad 43 on printed circuit board 12.

The specific printed circuit card 12 can be seen to fit into the slots 13 and 14 of modular card guide elements 72 and 73 of FIG. 2. Similar printed circuit cards can be inserted in the slots 74 and 75 of the card guide elements 76 and 77, with the opposite edges of such printed circuit card being inserted in slots in modular card guides not shown in the structure of FIG. 2 but which would be shown positioned above and opposite the card guide elements 76 and 77.

The modular card guides 11 are mated together by means of protuberances and mating cavities, such as the protuberances 64 and 65 in the lower card guides 11 in FIG. 2, and corresponding cavities, such as cavities 66 and 67, as shown at the other end of the modules 11 in the lower part of FIG. 2.

While the inner connections between the circuit board in the structure of FIGS. 1 and 2 are made by means of the surface-to-surface connectors 17, such interconnections between the circuit boards 12 can be made by other suitable means such as a back panel or a series of printed circuit board edge connectors positioned side-by-side along the rear of the card cage and into which the printed circuit cards, such as card 12, fit in conventional manner.

Referring now to FIGS. 3 through 5 there is shown a means for supplying both power to the card cage and for securing together the modular elements of the card cage into the assembled card cage. The sections 92 and 96 can be seen to be portions of the plastic modular elements as indicated in FIG. 4. More specifically, the elements 96 form elongated ribs of the modular card cage element that contain the slot into which the edges of the printed circuit board are slidably retained. It is evident from FIG. 4 that each end of the modular elements comprises at least four sections.

These four sections form a T-shaped connection with the card guide slot contained in sections 96, and are identified by reference characters 92 and 93 on one side of the T and 94 and 95 on the other side of the T. The four plastic elements 92, 93, 94 and 95 are hermaphroditic in that the sections 92 and 93 will mate with an adjacent pair of sections, such as sections 94 and 95, with the larger section 92 fitting over the smaller adjacent corresponding to section 94 and with the smaller section 93 on the left hand side of the T fitting into a larger adjacent section corresponding to the section 95 on the right hand side of the T. It is to be understood that the larger elements 92 and 95 are identical and the smaller plastic housing elements 93 and 94 are also identical.

To complete the hermaphroditic arrangement of the modular card cage elements a three legged contact 85 of FIG. 3 is secured within the plastic modular element 111 of FIG. 4. Such three legged contact is shown in detail without the housing in FIG. 3 and can be seen to be T-shaped with the two sections 86 and 87 which form the cross of the T being mounted on either side of the central leg 88. At the ends of each of the three legs 86, 87 and 88 are curved portions 89, 90 and 91 respectively with the curved portions 90 and 91 being visible in the perspective view of FIG. 3.

The curved portion 90 of FIGS. 3 and 4 is hermaphroditically engageable with a contact similar to curved portion 89 in an adjacent card cage module not shown in FIG. 4.

Referring now to FIG. 5 there is shown a sectional view of the structure of FIG. 4 taken along the plane 5—5 and in which the relationship of the positioning of the three legged contact within the T-shaped plastic housing is arranged.

All of the corresponding elements of both three legged contacts of FIG. 3 in the housing and the three legged contact shown in FIG. 4 are identified by similar reference characters. In addition the structure of FIG. 5 shows the series of window arrangements 100, 101, 102 and 103 interconnected by open channels 106 and 107 which permit entry of the three legged contact 85 of FIG. 3 into the plastic housing 111 of FIG. 4 from the bottom thereof as indicated in FIG. 5.

It is to be understood that the forms of the invention shown and described herein are but preferred embodiments thereof and that various configurations of rods and individual interlocking power carrying contacts can be employed to secure the card cage module together as well as to supply power thereto without departing from the spirit or the scope of the invention.

What is claimed is:

1. In an interconnection system having multiple cards with opposite side edges of said cards slidably mounted in slotted card guides and with electrical connectors mounted on said cards and electrically interconnecting adjacent cards, the improvement comprising:
   elongated conductors passing through said card guides,
   said card guides being distributed along said conductors, and
   electrical contacts in said card guides engaged with said conductors and frictionally engaging circuit paths on said cards without passing through said cards or entering said connectors,
   said cards being disengaged from said contacts upon slidable removal from said card guides.

2. The structure as recited in claim 1, wherein, said conductors are elongated conductive rods, said card guides are slidable along said rods, said contacts frictionally slidably engage said rods, said card guides cover said contacts, and portions of said rods are received through said card guides for frictional engagement by said contacts.

3. The structure as recited in claim 1, wherein, said conductors protrude from said card guides for electrical connection to a source of electrical power, and said contacts distribute electrical power from said conductors to said circuit paths on said cards.

4. In combination, a plurality of printed circuit cards and a card cage for holding said printed circuit cards, comprising:
   a plurality of pairs of modular card cage elements each having a card guide slot,
   said slots of corresponding pairs of elements being parallel with each other,
   said slots of each pair of elements being spaced apart a distance to slidably receive and retain therein the corresponding edges of a printed circuit card,
   means for securing said pairs of elements together in a stacked assembled arrangement to form parallel rows of slots with each row of slots receiving and retaining corresponding edges of printed circuit cards in a stacked parallel arrangement,
   said securing means comprising a plurality of conductive elements connectable together and extending in a continuous electrical path through the corners of said modular card cage elements,
   said conductive elements selectively forming the corner edges of said assembled card cage,
   said conductive elements further constructed to retain said card cage elements together in their stacked arrangement,
   said printed circuit cards have conductive areas formed on the surfaces thereof on at least two corners thereof,
   means for supplying predetermined voltages to said conductive elements,
   each card cage element including a cavity formed therein opening into a corresponding card guide slot and configured to retain one of said conductive elements therein, at least a portion of one of said conductive areas being received in said cavity, and, each of said conductive elements including a first contact portion and a second contact portion constructed to intermate with a said first contact portion of an adjacent said conductive element, and a third contact portion constructed to engage a corresponding said conductive area on a corresponding printed circuit card.

5. The structure as recited in claim 3, wherein, an electrical terminal is provided on each protruding portion of said conductor.

* * * * *